(12) United States Patent
Kagan et al.

(10) Patent No.: US 6,735,535 B1
(45) Date of Patent: May 11, 2004

(54) POWER METER HAVING AN AUTO-CALIBRATION FEATURE AND DATA ACQUISITION CAPABILITIES

(75) Inventors: Erran Kagan, Port Washington, NY (US); Andrew Repka, West Islip, NY (US); Tibor Banhegyesi, Baldwin Harbor, NY (US); Fred Slota, Coram, NY (US)

(73) Assignee: Electro Industries/Gauge Tech., Westbury, NY (US)

( * ) Notice: Subject to any disclaimer, the term of this patent is extended or adjusted under 35 U.S.C. 154(b) by 0 days.

(21) Appl. No.: 09/724,159

(22) Filed: Nov. 28, 2000

Related U.S. Application Data

(60) Provisional application No. 60/202,304, filed on May 5, 2000.

(51) Int. Cl.$^7$ .......................... G01R 21/00; G01R 35/04
(52) U.S. Cl. .......................... 702/61; 702/60; 702/85; 702/86; 324/74; 324/142
(58) Field of Search ............................. 702/60, 61, 62, 702/85, 86, 87, 88, 89, 99, 104, 57, 64, 65, 81, 182; 324/74, 141, 142, 140 R, 140 D

(56) References Cited

U.S. PATENT DOCUMENTS

| | | | | |
|---|---|---|---|---|
| 3,737,891 | A | * 6/1973 | Metcalf | 341/118 |
| 4,158,810 | A | 6/1979 | Leskovar | 324/127 |
| 4,415,896 | A | 11/1983 | Allgood | 340/870.03 |
| 4,709,339 | A | 11/1987 | Fernandes | 700/293 |
| 4,804,957 | A | * 2/1989 | Selph et al. | 340/870.03 |
| 4,979,122 | A | * 12/1990 | Davis et al. | 702/61 |
| 4,989,155 | A | * 1/1991 | Begin et al. | 702/62 |
| 5,006,790 | A | * 4/1991 | Beverly, II et al. | 324/104 |
| 5,017,860 | A | * 5/1991 | Germer et al. | 324/142 |
| 5,132,610 | A | * 7/1992 | Ying-Chang | 324/142 |
| 5,224,054 | A | 6/1993 | Wallis | 702/60 |
| 5,245,275 | A | * 9/1993 | Germer et al. | 324/142 |
| 5,450,007 | A | * 9/1995 | Payne et al. | 324/141 |
| 5,537,340 | A | * 7/1996 | Gawlik | 702/85 |
| 5,606,510 | A | * 2/1997 | Glaser et al. | 702/60 |
| 5,650,936 | A | 7/1997 | Loucks et al. | 702/62 |
| 5,736,847 | A | 4/1998 | Van Doorn et al. | 324/142 |
| 5,768,632 | A | * 6/1998 | Husted et al. | 710/72 |
| 5,896,547 | A | 4/1999 | Lee | 710/48 |
| 5,907,238 | A | * 5/1999 | Owerko et al. | 323/349 |
| 6,133,720 | A | * 10/2000 | Elmore | 324/74 |
| 6,163,243 | A | * 12/2000 | Titus | 336/174 |
| 6,269,316 | B1 | * 7/2001 | Hubbard et al. | 702/61 |

OTHER PUBLICATIONS

*Nexus 1250* manual by Electro Industries/Gauge Tech.
*High Performance Switchboard Power Monitors* manual by Electro Industries/Gauge Tech.

* cited by examiner

*Primary Examiner*—Marc S. Hoff
*Assistant Examiner*—Jeffrey R West
(74) *Attorney, Agent, or Firm*—Dilworth & Barrese LLP

(57) ABSTRACT

A power meter is provided having an auto-calibration feature and a data acquisition node for measuring the power usage and power quality of electrical power in an electrical power distribution network. The auto-calibration feature calibrates the power meter at predetermined time increments and as a function of temperature changes.

18 Claims, 2 Drawing Sheets

POWER METER HAVING AN AUTO-CALIBRATION FEATURE AND DATA ACQUISITION CAPABILITIES

The present application claims priority to a United States Provisional Application filed on May 5, 2000 by Kagan et al. having U.S. Provisional Application No. 60/202,304; the contents of which are incorporated herein by reference.

BACKGROUND OF THE INVENTION

1. Field of the Invention

The present invention relates to electrical power distribution networks. In particular, the present invention relates to a power meter having an auto-calibration feature and a data acquisition node for measuring the power usage and power quality of electrical power in an electrical power distribution network.

2. Discussion of the Related Art

With the proliferation of electrically powered devices and systems, there is an increasing need to accurately and precisely measure and monitor the quality of the electrical power supplying these devices and systems. While electrical utility companies currently use devices to measure the amount of electrical power used by both residential and commercial facilities and use devices to measure the quality of electrical power in an electrical power distribution network, these devices generally do not reproduce the incoming electrical signal accurately in order to perform a detailed and precise analysis of the incoming power quality and usage. Power quality refers to the amount of power spikes, sags, surges, and flicker, as well as other characteristics. As such, power quality monitoring is especially important when expensive and sensitive electrical equipment is connected to the power distribution network.

Therefore, there exists a need in the art for a device which can accurately and precisely reproduce an incoming electrical signal and perform detailed and precise electrical power quality and power usage analysis.

SUMMARY OF THE INVENTION

The present invention provides a power meter having an auto-calibration feature and a data acquisition node for measuring the power usage and power quality of electrical power in an electrical power distribution network.

BRIEF DESCRIPTION OF THE DRAWINGS

The invention is further explained by way of example and with reference to the accompanying drawings, wherein.

DETAILED DESCRIPTION OF THE PREFERRED EMBODIMENTS

The present invention combines the features of a high end revenue meter with advanced power quality analysis capabilities. A feature of the power meter of the present invention is its ability to auto-calibrate voltage and current inputs, either on command or upon the triggering of a certain event. The power meter of the present invention periodically checks its temperature and auto-calibrates when the temperature changes by more than a fixed or predetermined amount, usually 1.5 degrees centigrade. The power meter also auto-calibrates when a pre-set timer expires. The time is preferably set to periodically expire every 15 minutes to every six hours.

I. Hardware Operation

Figure 1A:
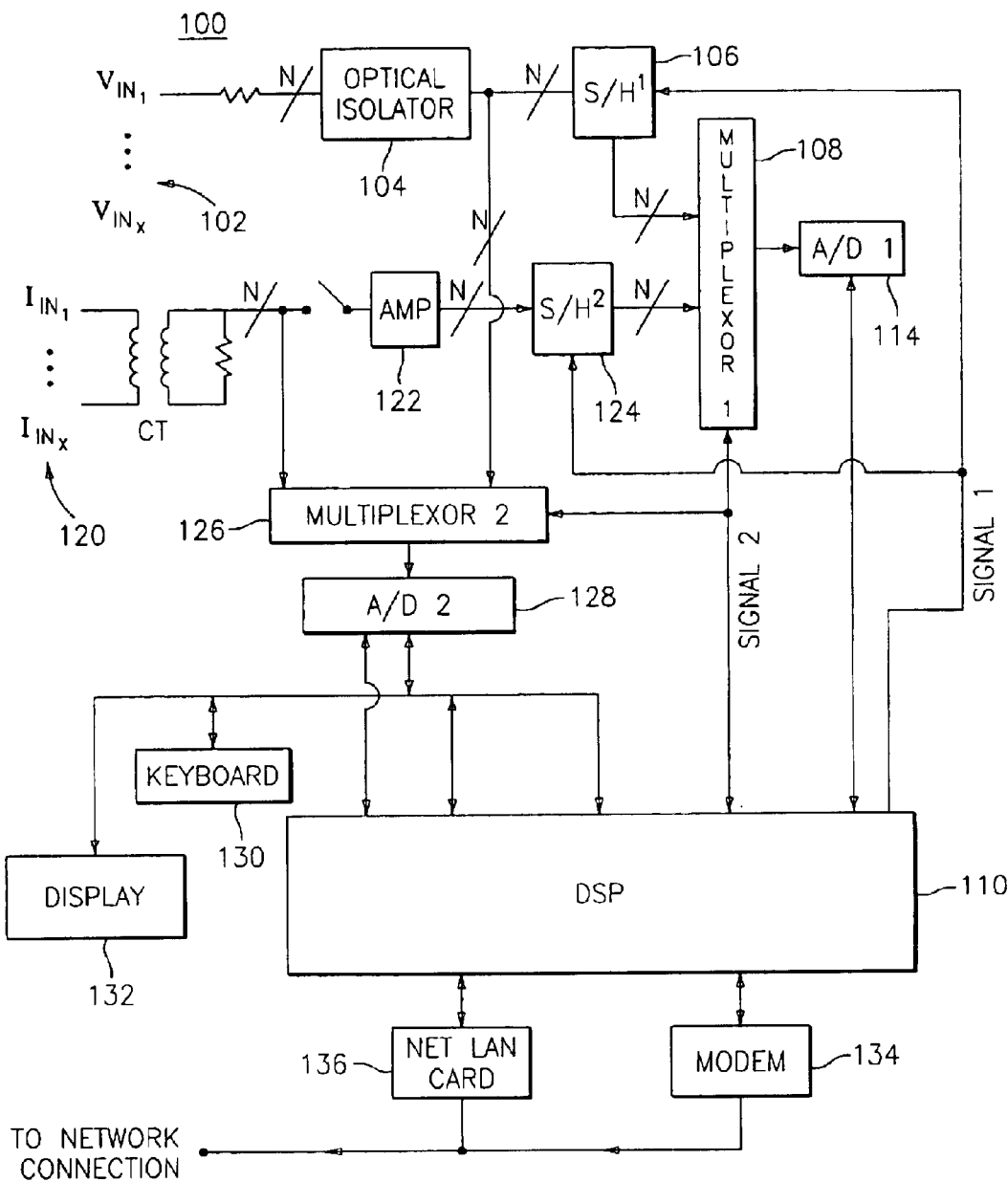
FIG. 1A is a diagram of a power meter according to the present invention.

Referring to FIG. 1A, there is shown an exemplary diagram of a power meter for calibrating voltage and current inputs according to the principles of the present invention. The power meter is designated generally by reference numeral 100 and includes a plurality of voltage input lines 102, Vin, for receiving N voltage inputs which are optically isolated by a respective optical isolator 104, as known in the art, to protect the power meter 100. The N voltage inputs are received from the respective optical isolators 104 by a respective sample and hold circuitry 106 (S/H 1). Based on a control signal, the N voltage outputs of the respective sample and hold circuitry 106 are transmitted to a first multiplexor 108. The first multiplexor 108 receives a control signal (SIGNAL 2) from a DSP 110 to output at least one of the N voltage outputs received from the respective sample and hold circuitry 106. The voltage output from the first multiplexor 108 is received by a first analog-to-digital converter 114 which converts the analog voltage output signal to a digital voltage signal. The digital voltage signal is subsequently transmitted to the DSP 110.

The power meter 100 also includes a plurality of current input lines 120, Iin, which receive N current inputs which are sampled through respective current transformers CT. The N current inputs are transmitted to a respective amplifier 122 and then to respective sample and hold circuitry 124 (S/H 2). Based on control signal (SIGNAL 1), the sample and hold circuitry 124 transmits the N current inputs to the first multiplexor 108. Subsequently, based on control signal (SIGNAL 2), the first multiplexor 108 outputs a current output to the first analog-to-digital converter 114, which is subsequently transmitted to the DSP 110.

The N voltage inputs and N current inputs are also received by a second multiplexor 126 and at least one voltage input and at least one current input are transmitted to a second analog-to-digital converter 128 based on the control signal (SIGNAL 2). The outputs from the second analog-to-digital converter 128 are transmitted to the DSP 110. The DSP 110 is connected to peripherals, such as a keyboard 130, a display 132, a modem 134, and a network card interface 136 for communicating with the power meter 100 from a remote station (not shown), preferably through a network connection.

The digital representation of each of the N voltage and N current inputs is processed and stored within the DSP 110. The DSP 110 includes at least a random access memory (RAM) and a read only memory (ROM).

Figure 1B:
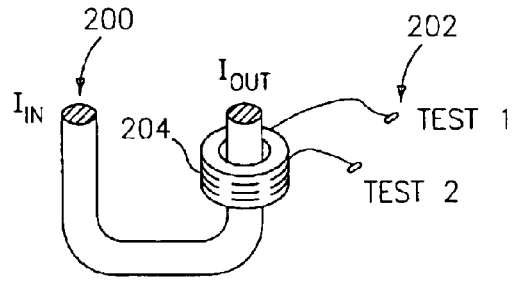
FIG. 1B illustrates a coupling device of the power meter of FIG. 1 for coupling the power meter to an electrical power line to protect the power meter from excessive current.

Referring to FIG. 1B, there is shown a coupling device for sampling the N current inputs while protecting the power meter 100 from excessive current. The input and output currents Iin, Iout are connected via a U-shaped metal rod 200, which is preferably ¼ inch thick, that bears current for the input current signal Iin. The current of the input current signal In is measured via a toroid sensor 202 attached to a toroid 204. The toroid 204 is implemented to preferably convert the input current to a proportional voltage. The U-shaped metal rod 200 traverses through the toroid 204 for the input current signal Iin, as noted above. The metal rod 200 also acts as a primary winding having a single turn and the toroid 204 acts as the secondary winding. The toroid 204 preferably contains approximately 1000 turns.

Figure 2:
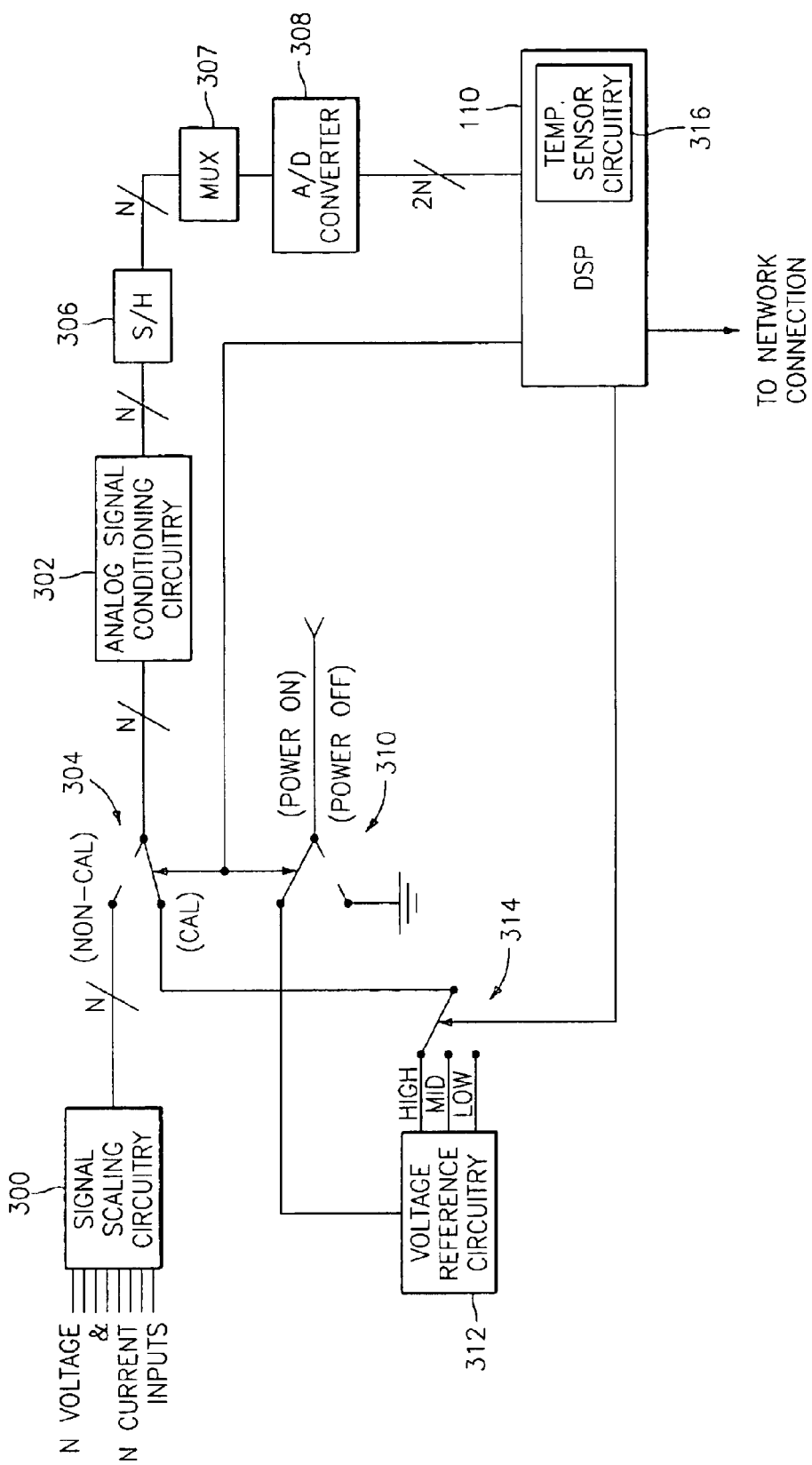
FIG. 2 is a block diagram of an auto-calibration feature of the power meter of FIG. 1A.

FIG. 2 illustrates a simplified block diagram of the power meter 100 illustrated by FIG. 1A, including the components for implementing the auto-calibration feature of the power meter 100 according to the present invention. The N voltage and N current inputs, preferably, four voltage inputs and four current analog inputs, are received by signal scaling circuitry 300 which scales the input analog signals to measurable levels, as known in the art. The analog signals are fed to analog signal conditioning circuitry 302, which includes optical isolators 104 for receiving the N voltage inputs and current transformers CT for receiving the N current inputs, as well as amplifier 122 for conditioning the analog signals, as known in the art. The analog signals are fed to circuitry 302 if a calibration mode switch 304 controlled by the DSP 110 is switched to a non-calibration position (non-Cal).

After the analog input signals are conditioned by circuitry 302, the conditioned analog signals are provided to sample and hold circuitry 306 which combines sample and hold circuits 106, 124. Circuitry 306 "freezes" the analog signals and provides the signals to a multiplexor 307 (analogous to multiplexor 108) which outputs one signal at a time to an analog-to-digital converter 308 (analogous to the first analog-to-digital converter 114). The digitized signals are then provided to the DSP 110, in order for the DSP 110 to obtain accurate power quantity difference measurements and other measurements, such as a time delay, between the digitized signals.

The power quantity measurements are prone to deviate from the actual quantities due to temperature changes. That is, if the temperature changes, there is an adverse effect on the analog signal conditioning circuitry 302, especially the at least one optical isolator 104 and the at least one current transformer CT as known in the art, which causes errors, i.e., the power quantity difference measurements of the voltage and current inputs deviate from respective ideal parameters.

In order to calibrate for the errors presented due to temperature changes, component aging, etc., periodically, e.g., every 15 minutes, every one hour, etc., the DSP 110 switches the power meter 100 to the calibration mode. The power meter 100 is switched to the calibration mode by the DSP 110 providing a signal to calibration mode switch 304 to switch to a calibration position (Cal); by providing a signal to a power on/off switch 310 to switch to a power-on position (power-on) to provide an operating voltage to voltage reference circuitry 312 for generating high, medium and low reference voltages as known in the art; and by providing a signal to a reference voltage selector switch 314 to select reference voltages outputted by the voltage reference circuitry 312. During each calibration cycle, the DSP 110 uses each of the three reference voltages to calibrate a range of measurements for various parameters of the voltage and current inputs and subsequently, computing a correction factor for each of the range of measurements for adjusting the gain and zero offset of the power meter 100 to adjust for temperature changes.

The selection between the high, medium and low reference voltages is determined by the DSP 110, according to the extent of the errors presented within the analog signal conditioning circuitry 302. The DSP 110 is aware of the extent of the errors, e.g., the amount of deviation of the power quantity measurements from the ideal power quantity measurements, as the extent of the errors has been determined and stored within the DSP 110 during factory calibration.

Specifically, upon selecting each of the high, medium and low reference voltages, the reference voltage is provided to the DSP 110, in order for the DSP 110 to compute the calibration factors using software routines, as discussed in the next section. The calibration factors are then used to calibrate the power meter 100. The calibration factors could include, for example, calibration factors for adjusting the phase delay of the analog signals or for compensating for the deviation amount regarding the power quantity measurements.

The DSP 110 also includes temperature sensor circuitry 316, as known in the art, for sensing a temperature change. Upon detection of a predetermined temperature change, the DSP 110 automatically switches the power meter 100 to the calibration mode, by transmitting at least one signal to the calibration mode, power on/off, and reference voltage selector switches 304, 310, 314 to switch the switches to the calibrate position, power-on position, and to each of the reference voltages, respectively, in order to perform calibration of the voltage and current inputs, as discussed above.

Upon properly calibrating the power meter 100 due to a temperature change or the expiration of the timer, the DSP 110 provides a signal to the calibration mode switch 304 to switch to the non-calibration position. The DSP 110 also provides the same signal or another signal to the power on/off switch 310 to switch to a power-off position (power-off). Accordingly, the power meter 100 resumes normal operation, i.e., the power meter 100 operates in the non-calibration mode.

II. Software Operation

The power meter 100 incorporates several routines which are programmed as a set of programmable instructions within the DSP 110, in order for the power meter 100 to achieve a high degree of accuracy. A Main Operating routine runs continuously and contains a Reference Calibration procedure for calibrating the voltage and current inputs as described in the previous section, a Vector Calibration procedure, a Phase Calibration procedure and a Fast Fourier Transform (FFT) procedure. In addition, a Sampling Interrupt routine runs while the Main Operating routine is running. The Sampling Interrupt routine is responsible for collecting samples of the incoming voltage and current inputs, calibrating the samples and performing various power calculations on the calibrated samples to measure at least the power quantity of the inputs.

The Main Operating routine which is programmed as a set of programmable instructions within the DSP 110 and controlled by the DSP 110 will now be described. A runcheck flag is set which indicates whether the Main Operating routine has run recently; if not, the power meter 100 resets. The Main Operating routine coordinates data and data flow with the DSP 110. The DSP 110 contains operating parameters and system commands and preferably stores the information in a flash memory for retrieval by other devices.

The different routines used by the power meter 100 follow a hierarchy. A 0.1 second routine, in which data is processed, is the most important and will interrupt any process when it is executed. Second in importance is the 1.0 second routine in which data is processed. Lastly, the Main Operating routine is executed. In this manner, whenever one of the more important routines is ready to be executed, the current location, i.e., address, and data of the current routine, i.e., the routine that is to be interrupted, is stored in a stack, the important routine is executed, and the routine then pops the address and data from the stack and continues with the routine that was interrupted. For example, if the Main Operating routine is being executed and a 0.1 second flag is set indicating that there is enough data to run the 0.1 second routine, the Main Operating routine is interrupted and the 0.1 second routine is executed.

Following the Main Operating routine is a Reference Calibration routine, Ref Cal. The Reference Calibration routine, while important, does not have to be executed all the time. It can be periodically scheduled. The Ref Cal routine is executed whenever the current temperature changes by more than a fixed amount, usually 1.5 degrees centigrade or a timer expires. Preferably, the timer is set to periodically expire every 15 minutes to every six hours. Since the electrical properties of certain internal testing circuit elements, especially within the analog signal conditioning circuitry 302, change with temperature, this feature ensures that the power meter 100 will be as accurate as possible.

Continuing from the Main Operating routine, the procedure asks for the current temperature. If the temperature difference is greater than 1.5 degrees centigrade from the previous value, the procedure stores the new temperature as the previous value and auto-calibrates. The procedure then checks to see if an Mcal ST is set. The first run through the procedure, sets the Mcal ST flag to false.

If the temperature value difference is not greater than 1.5 degrees, the procedure determines whether the Ref Cal procedure was run in the last interval, preferably, the last 15 minutes. This is accomplished by checking the status of a pass flag. If the pass flag is set to true, the procedure checks the status of the Mcal ST flag. If the Mcal ST flag is false, the procedure checks the Vcal Flag, which determines if the procedure should run the Vector Calibration routine (see below).

The first run through the procedure, sets the Mcal ST flag to false. This causes the procedure to check a Vcal_ch value. The Vcal_ch value determines what reference input voltage is applied for sampling. If it is zero, the procedure sets the input to the power meter 100 to a preset Clow value, e.g., −2.5 volts, and sets a Clow Pointer (PTR) to store the calculated low value. The procedure then sets the Mcal ST flag, sets the Cal ST (calibration start) flag and increments the Vcal_Ch. The procedure then continues in the Main Operating routine and checks the Vcal flag. In this manner, when the Main Operating routine returns to this procedure, i.e., the processor is not busy with other functions, the Mcal ST flag will be true and the Cal ST flag will be true.

Thus, a group of samples will be collected with a known input signal applied, such as, e.g., a −2.5V (Clow) input signal. The DSP 110 calculates and stores A/D values for an incoming electrical signal (such as voltage or current) on all input channels, and after a set number of samples, e.g., 128 samples, the Cal ST flag is then cleared and on the next pass through, the stored samples are accumulated and divided by the number of samples. This averaged value is then stored at the Cal PTR location (previously Clow), and the Mcal ST flag is cleared. The next pass through the routine, with the Vcal_Ch previously incremented, will move to the Vcal_Ch=1 routine where the same process is repeated for a mid-value of 0 volts. Finally, the routine is performed for the Vcal_Ch=2 where a high value, e.g., 2.5V, is applied. Once the Vcal_Ch=2 routine is performed, the DSP 110 then performs several calculations when Vcal_Ch=2 is negative. The mid-value becomes a new zero offset and is combined with an original gain factor for the electrical signal being analyzed to yield a grand total gain factor. The grand total gain factor is used to calibrate the voltage and current samples. If, for example, the max input value to the A/D converter is 5V, then 5/(A/Dhigh-A/Dlow) is equal to the gain.

The Vector Calibration routine is performed initially at the factory during factory calibration and only in the field upon some kind of operator intervention, such as transmitting a control signal from a remote control station to the power meter 100 to perform the Vector Calibration routine. The Vector Calibration routine accounts for the phase error associated within the power meter 100 itself. The power meter 100 preferably samples all channels and stores them. If the Vcal Flag is set, then for a period of say eight seconds in the one-second routine, the DSP 110 will record, for example, eight readings in the case of eight channels and compute an average gain. The Vector Calibration routine will then compute the difference between the factory gain and what it determined from the eight samples. The difference will be a new overall calibration factor which corrects for errors associated with the electrical components of the power meter 100.

A Phase Calibration routine is performed after the Vector Calibration routine. The Phase Calibration routine applies a fixed factor phase correction determined in the factory and has an initial value of 1. This corrects for errors, i.e., deviations from the ideal values, associated with the current transformers CTs within the conditioning circuitry 302. The correction is applied as a phase calibration to the sampled signals.

Following the Phase Calibration routine in the Main Operating routine, a Fast Fourier Transform (FFT) is performed to calculate a number of harmonics, e.g., up to 128 harmonics, of the input signal as known in the art. Once the FFT is completed, the procedure returns to the beginning of the Main Operating routine.

Running continually in conjunction with the Main Operating routine is a Sampling Interrupt routine. The Sampling Interrupt routine gathers digital representations of the incoming voltage and current inputs and applies the calibration factors derived from the various calibration routines in order to create and store accurate representations of the input signal. Assuming the input signal is 60 Hz, this indicates that there are 60 cycles per second. The Sampling Interrupt routine is done on a cycle-by-cycle basis. After each cycle of sample data, the routine checks to see if it has 0.1 seconds worth of data. If it does not, the Sampling Interrupt routine runs another cycle.

As soon as enough data is stored for 0.1 seconds, the Sampling Interrupt routine sets the 0.1 sec flag to true. When enough samples are gathered to perform calculations, either at 0.1 second or 1.0 second, the Sampling Interrupt routine and the Main Operating routine are interrupted and a corresponding 0.1 sec or 1.0 sec procedure is performed. The 1.0 sec procedure is similar to the 0.1 sec procedure described above, but performs additional calculations on the samples. The 0.1 second reading is performed using approximately 384, i.e., 64*6, individual samples, and voltage, current and power are calculated for these samples. These values are calibrated and used for high speed reporting updates and are not revenue accurate values. The 1.0 second reading is performed after approximately 4000 readings and is used for revenue accurate readings.

To summarize the 1.0 second routine, the process starts off by calculating all full scale power factors for V, I and power (W). These are computed differently for different types of current transformers CTs. After the Full Scale (FS) values are determined, the 1.0 second routine checks if there is an input hookup. If so, the current is zeroed and the 1.0 second routine determines if Vab,Vbc,Vca are equal to zero. If the voltage is not equal to zero, the Phase Calibration routine is performed. This is the only calibration routine that is performed on the 1.0 second level and not on the individual samples. The Phase Calibration routine is initially performed at the factory and a fixed number is stored in the memory of the power meter 100.

The Phase Calibration routine is performed as follows. A power factor (PF) is calculated by dividing watts, i.e. V*I, by the VA, i.e. the RMS value of V*I. This power factor is then used to compute a phase correction based on the PF and I readings. The correction value is used to correct the watts for the phase error and since the watts were changed when the new PF was calculated, the Var must also be recalculated since Var is equal to the square root of $Va^{2-W2}$. When the unit is initially calibrated at the factory a fixed calibration value is calculated and stored in the unit. For example, at the factory, a signal with a value of 60 degrees is input and the calibration correction is adjusted up or down until the DSP 110 measures a correct reading. When the unit is placed in the field, current and voltage samples are obtained and V and I are used to determine watts, W=VI.

Since PF is equal to cosine of the angle between the voltage and current, the PF is used to determine an initial phase angle for the angle of the actual signal. How far off the initial phase angle differs from, for example, a factory setting of 60 degrees is determined and adjusted for accordingly. The adjustment is performed by taking the difference of the two angles, i.e., PF difference, performing a proportion gain calculation and based on the ratio, which is not linear but a cosine relationship, calculating a correction phase angle. This value is added to the original measured angle and an inverse cosine function is used to obtain the exact representation of the phase. For a sample calculation, see the summary of examples below.

Referring to the Sampling Interrupt routine, if the 0.1 sec flag is not set, the Sampling Interrupt routine checks to see if the Qflag is set. If it is set, Var (reactive power) measurements (i.e., volt-amp reactive part) are performed every 0.1 sec routine, four samples are preferably recorded to setup Q readings. The samples are always synchronous. While the Sampling Interrupt routine can lose several samples, a group of 64 samples is preferably always used for each cycle. It does not matter where in the cycle the cycle is started as long as it consists of one full cycle. Thus, continuous sampling is performed even if a sample is missed. When the counter for the Var routine reaches zero, the Qflag is cleared, the 0.1 sec flag is set and the count is set to 64. The Sampling Interrupt routine then exits back to the Main Operating routine.

After the Qflag is checked, the Sampling Interrupt routine checks for a FFT flag. If it is set, the power meter 100 performs the FFT procedure to determine the signal harmonics. Finally, if the FFT flag is not set, the Sampling Interrupt routine checks for a calibration flag, CAL fl. If this is set, the Sampling Interrupt routine proceeds to a Cal mod to Sample routine which coordinates the activities of the DSP 110 and other processors of the power meter 100 to prevent erroneous readings.

The power meter 100 of the present invention records incoming waveforms based upon status changes and the occurrence of other events, such as power spikes and surges. The power meter 100 is capable of high speed waveform recording for later use in troubleshooting electrical power-related problems. In addition, the power meter 100 records harmonics of the incoming signal to the $127^{th}$ order. Additionally, the power meter 100 performs a flicker analysis for power quality and system stability applications. The power meter 100 also records the sequence of events using an IRIG-B satellite timing system (GPS) which is able to synchronize a recording of network events to an absolute time within one millisecond.

The power meter 100 of the present invention is expandable and can read a plurality of current and voltage input signals simultaneously. In addition, the power meter 100 is remotely accessible from a central monitoring station. The data obtained by the power meter 100 can be downloaded to a monitoring station for further analysis using an open protocol.

The power meter 100 of the present invention includes several features which prevent and protect the power meter 100 from harsh substation transients. Specifically, voltage and current spikes from the substations may damage ordinary power and revenue metering devices. The present invention incorporates optically isolated voltage inputs which provides superior protection from voltage spikes. In addition, as described above, the power meter 100 includes a quarter-inch, U-shaped bolt or metal rod which bears the current inputs in order to protect the power meter 100 from the current inputs (see FIG. 1B). The U-shaped bolt acts as a direct short and monitors the input current using an internal toroidal sensor which converts the input current to a proportional voltage.

The power meter 100 of the present invention preferably includes an on-board Ethernet card and an on-board modem for communicating with a remote station. In addition, the power meter 100 includes a multi-port RS485 communication terminal. An example will now be described with respect to the power meter 100 of the present invention.

Example

Start: Describe
1. Calibration ("Cal.") Reference, Vector Cal., Phase Cal. are all set to 1 for all current and voltage ranges.
   a) There is one calibration and offset factor for each voltage and current input.
   b) The sample gain correction factor (SGCF) is:

SGCF=(Range vector factor)×(Calibration factor)

c) The SGCF is computed for each range (120V—volts), (0.25A, 0.5A, 1A, 2.5A, 5A—current) for all voltage and current inputs and each sample is multiplied by this factor.

Start: Apply-Gain
   This following sequence calibrates the reading regardless of whether a unit is calibrated or not. The two factors applied to each sample are:
   SGCFO—overall sample gain correction factor
   SOF—sample offset factor
   These factors are derived from the following factors obtained during calibration at the set points for the range:
   $SGCF_{120V}$, $SGCF_{0.25A}$, $SGCF_{0.5A}$, ..., $SGCF_{5A}$
   How these factors, the calibration factors and offsets are obtained and computed are described in the calibration sections below.
1. Sampling—For each voltage/current channel sample:
   A/Dcal=(A/Dvalue×SOF)×SGCFO
   The samples are now calibrated for gain.
2. Compute $$\frac{V}{I} = \sqrt{\sum \frac{A/D_{cal}^2}{n}}$$

This is synchronized to the cycle so after 0.1 or 1.0 sec. of cycles, this is the Calibrated RMS Value of Volts/Current.
3. A/D full scale for volts=432.3 V
   Current=52.23 A
   $RMS_{V/I}$=A/DRMS×432.3V/52.23 A
4. All other readings are derived from these values.
5. At the 1.0 sec computation, adjust the current SGCFO factor for the range proportionality as follows:

a) Get the last current reading: for this example, use I=0.75A
b) Determine which band it is in: for this value it is between cal. points 0.5A and 1A.
c) Proportion the gain: assume the $SGCF_{0.5A}$ factor is 1 and $SGCF_{1A}$=2.
d) Compute:
   1) New $SGCF_1=(I_m-0.5)/(1-0.5)$
      In this case (0.75−0.5)/(1−0.5) (2−1)+1=1.5
   2) SGCFO=$SCGF_1$×Calibration factor
      This is the new value applied to all samples in the Sampling Interrupt routine.

Apply Phase
Each Phase—A, B, C has phase factors at the calibration points for several ranges at phase angles of 60 deg. between V and I. These are $PHF_{0.5}$, $PHF_1$, $PHF_{2.5}$, $PHF_5$, $PHF_{10}$.
1) These factors correct Watts only.
2) Every second the Watt value and the Power Factor PF are computed, where
   $PF=Watts/V_{RMS}*I_{RMS}$
   $Cos^{-1}(PF)$ is computed to determine the phase angle.
3) Assume phase angle for current PF=30 deg., I=0.75A, $PHF_{0.5}$=1, $PHF_1$=2.
   a) First as above find current range between 0.5A and 1A
      Proportion gain:
      Gain=$[(cos(30)-cos(60))/1]$ $[(I_{RMS}-I_L)/(I_H-I_L)]$ $[(PHF_H-PHF_L)]+PHF_L$
      For this example $PHF_H$ and $PHF_L$ are the 1A and 0.5A PH factors due to the current of 0.75A.
      Compute Gain=$[((0.866-0.5)/1)$ $(0.75-0.5)/(1-0.5)$ $(2-1)+1]$=1.18
      Multiply Watts times the computed gain and recompute.
      Final PF=New Watts/$V_A$ Start—Do Ref Cal
1) Schedule a manual or auto reference calibration.
2) In the Sampling Interrupt routine for each channel do the following:
   a) High turn on 2.5 V reference calibration
      Measure 128 A/D samples and average
      Convert the average to volts. Assume results are Cal. High=2.4 V
3) a) Next do low—turn on −2.5 V.
   do same calculations as 2)a) and assume
   Cal. Low=−2.35 V
4) a) Next do mid—turn on ground
   Compute and average 128 Values
   Assume Cal. Mid=0.6 V
   b) Cal mid is the offset factor SOF applied to each sample in part 1) of "Start:
   Apply Gain" section above
5) Compute Calibration factor=5/($Cal_H-Cal_L$)
   Cal factor here is 5/(2.4−(−2.35))=1.052
   This is factor used to multiply all the SGCF range factors to get the SGCFO factor (see "Start: Apply Gain" section, above).

Start—Do Vector Calibration
1) Vector calibrations are manually done at the factory. A calibrated volt/current is input and the unit is calibrated for that range value. These are the SGCF values mentioned above. It is assumed a reference cal has been previously done.
2) Calibrate for each Range, e.g., 1A—Set $SGCF_{1A}$ to 1.
   a) Input 1A then press button
   b) Unit will average eight 1.0 sec readings for the range selected and compute the difference between what was input and measured
      $SGCF_{1A}$=1A/(8 Ave. Amp values)
      This is the value used in the "Start: Describe" section above.
      Get SGCFO.
3) Repeat for all ranges, volts and amps.

Start—Phase Calibration
1) Set power factor of 0.5
   Set inputs to phase ranges with input currents of 0.5, 1, 2.5, 5, 10 amps, respectively.
2) For each range, e.g. 0.5A, check display reading against what it should be, i.e., as computed.
   Increment/decrement the phase correction factor until the watts read correctly.
   This is the factor (PHF) used to correct the phase in the "Apply Phase" section above.

Although the illustrative embodiments of the present disclosure have been described herein with reference to the accompanying drawings, it is to be understood that the disclosure is not limited to those precise embodiments, and that various other changes and modifications may be affected therein by one skilled in the art. That is, those skilled in the art will envision other modifications within the scope and spirit of the claims appended hereto.

What is claimed is:

1. An auto-calibrating power meter comprising:
   circuitry configured to receive a plurality of voltage and current inputs including analog conditioning circuitry, which includes a plurality of optical isolators for receiving the plurality of analog voltage inputs and a plurality of current transformers for receiving the plurality of current inputs, and sample and hold circuitry for sampling and holding the plurality of voltage and current inputs to be individually converted from analog to digital signals; and
   processing circuitry configured to measure at least one parameter of the received digitized plurality of voltage and current inputs, to select at least one reference voltage during a calibration mode for calibrating a range of measurements for the at least one measured parameter of the received digitized plurality of voltage and current inputs, and to compute at least one calibration factor, which corrects drift errors occurring in the analog voltage inputs from the optical isolators, for the range of measurements for calibrating at least one parameter of the received digitized plurality of voltage and current inputs;
   wherein the processing circuitry executes several routines for computing the at least one calibration factor in a hierarchical order of a 0.1 second routine having a highest priority, a 1.0 second routine having a next highest priority, and a main routine having a lowest priority.

2. The power meter according to claim 1, further comprising a metal rod traversing through a toroid for connecting the plurality of current inputs to a plurality of current outputs.

3. The power meter according to claim 2, wherein the toroid contains approximately 1000 turns.

4. The power meter according to claim 2, wherein the toroid is connected to a toroid sensor for measuring the current of at least one current input of the plurality of current inputs.

5. The power meter according to claim 1, wherein the sample and hold circuitry for receiving the plurality of voltage and current inputs provides the inputs to a multiplexor for outputting one input at a time to an analog-to-digital converter for digitizing the plurality of voltage and current inputs.

6. The power meter according to claim 5, wherein the digitized plurality of voltage and current inputs are provided to the processing circuitry.

7. The power meter according to claim 1, further comprising voltage reference circuitry configured to generate the at least one reference voltage.

8. The power meter according to claim 1, further comprising a calibration mode switch operatively controlled by the processing circuitry for switching between a calibration position to compute the at least one calibration factor and a non-calibration position for receiving the plurality of voltage and current inputs.

9. The power meter according to claim 8, wherein the processing circuitry switches the calibration mode switch to the calibration position upon the periodic expiration of a timer.

10. The power meter according to claim 9, wherein the timer is set to periodically expire every 15 minutes to every six hours.

11. The power meter according to claim 8, wherein the processing circuitry switches the calibration mode switch to the calibration position upon a temperature change of more than a predetermined amount.

12. The power meter according to claim 1, wherein the at least one parameter of the power meter that is calibrated is selected from the group consisting of the gain and zero offset of the power meter.

13. The power meter according to claim 1, further comprising temperature sensor circuitry for sensing a temperature change.

14. The power meter according to claim 13, wherein upon sensing of the temperature change by the temperature sensor circuitry, the processing circuitry switches a voltage selection switch to select the at least one reference voltage and a calibration mode switch to a calibration position to compute the at least one calibration factor.

15. The power meter according to claim 1, further comprising means for communicating with a remote station.

16. A method for auto-calibrating at least one parameter of a received plurality of voltage and current inputs in a power meter, the method comprising the steps of:

receiving the plurality of analog voltage inputs and the current inputs by the power meter;

performing analog conditioning of the plurality of analog voltage inputs and the current inputs utilizing a plurality of optical isolators;

sampling and holding the plurality of inputs to be individually converted from analog to digital signals;

measuring at least one parameter of the digitized plurality of voltage and current inputs;

selecting at least one reference voltage for calibrating a range of measurements for the at least one measured parameter; and computing at least one calibration factor, which corrects drift errors occurring in the analog voltage inputs from the optical isolators, for the range of measurements for calibrating the at least one parameter of the digitized plurality of voltage and current inputs;

wherein the at least one calibration factor is computed in a hierarchical order of a 0.1 second routine having a highest priority, a 1.0 second routine having a next highest priority, and a main routine having a lowest priority.

17. The method according to claim 16, wherein the at least one parameter of the power meter that is calibrated is selected from the group consisting of the gain and zero offset of the power meter.

18. The method according to claim 1, further comprising the step of providing a communication link between the power meter and a remote station.

* * * * *